US007009694B2

(12) United States Patent
Hart et al.

(10) Patent No.: US 7,009,694 B2
(45) Date of Patent: Mar. 7, 2006

(54) INDIRECT SWITCHING AND SENSING OF PHASE CHANGE MEMORY CELLS

(75) Inventors: Mark W. Hart, San Jose, CA (US); Chung H. Lam, Peekskill, NY (US); Christie R. K. Marrian, San Jose, CA (US); Gary M. McClelland, Palo Alto, CA (US); Simone Raoux, Cupertino, CA (US); Charles T. Rettner, San Jose, CA (US); Hemantha K. Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/856,547

(22) Filed: May 28, 2004

(65) Prior Publication Data

US 2005/0265072 A1     Dec. 1, 2005

(51) Int. Cl.
*G11C 11/00* (2006.01)
(52) U.S. Cl. .................. 356/163; 365/161; 438/102
(58) Field of Classification Search ................ 365/163, 365/161, 148, 225.7, 210, 202, 226, 63, 51; 257/2; 438/102
See application file for complete search history.

(56) References Cited

U.S. PATENT DOCUMENTS

| 4,845,533 | A | 7/1989 | Pryor et al. |
| 5,177,567 | A | 1/1993 | Klersy et al. |
| 5,222,067 | A | 6/1993 | Hiroshi |
| 5,275,712 | A | 1/1994 | Hetrick et al. |
| 5,432,746 | A | 7/1995 | Guedj |
| 5,606,524 | A | 2/1997 | Ozaki et al. |
| 5,687,706 | A * | 11/1997 | Goswami et al. ...... 126/263.01 |
| 5,812,461 | A | 9/1998 | Komarek et al. |
| 5,825,046 | A | 10/1998 | Czubatyj et al. |
| 5,886,949 | A | 3/1999 | Villa et al. |
| 6,075,750 | A | 6/2000 | Campardo et al. |
| 6,087,674 | A | 7/2000 | Ovshinsky et al. |
| 6,137,576 | A | 10/2000 | Pauluth et al. |
| 6,150,253 | A * | 11/2000 | Doan et al. .................. 438/597 |
| 6,169,423 | B1 | 1/2001 | Campardo et al. |
| 6,314,014 | B1 | 11/2001 | Lowrey et al. |
| 6,379,910 | B1 | 4/2002 | Nakamura et al. |
| 6,426,891 | B1 | 7/2002 | Katori |
| 6,546,806 | B1 | 4/2003 | Varma |
| 6,579,760 | B1 * | 6/2003 | Lung .......................... 438/257 |
| 6,590,807 | B1 | 7/2003 | Lowrey |
| 6,597,009 | B1 * | 7/2003 | Wicker .......................... 257/4 |
| 6,653,704 | B1 * | 11/2003 | Gurney et al. .............. 257/421 |

(Continued)

*Primary Examiner*—Van Thu Nguyen
*Assistant Examiner*—Dang T. Nguyen
(74) *Attorney, Agent, or Firm*—Gibb I.P. Law Firm, LLC; Daniel E. Johnson

(57) ABSTRACT

A method and structure for a memory cell comprising a phase change material; a heating element in thermal contact with the phase change material, wherein the heating element is adapted to induce a phase change in the phase change material; and electrical lines configured to pass current through the heating element, wherein the phase change material and the heating element are arranged in a configuration other than being electrically connected in series. The memory cell further comprises a sensing element in thermal contact with the phase change material, wherein the sensing element is adapted to detect a change in at least one physical property of the phase change material, wherein the sensing element is adapted to detect a change in a thermal conductivity of the phase change material.

57 Claims, 11 Drawing Sheets

U.S. PATENT DOCUMENTS

| | | |
|---|---|---|
| 2002/0039310 A1 | 4/2002 | Chiang et al. |
| 2002/0101812 A1 | 8/2002 | Wickramasinghe et al. |
| 2003/0026134 A1 | 2/2003 | Lowrey |
| 2003/0027398 A1 | 2/2003 | Maimon et al. |
| 2003/0067013 A1 | 4/2003 | Ichihara et al. |
| 2003/0123284 A1 | 7/2003 | Lowrey et al. |
| 2003/0128568 A1 | 7/2003 | Nangle |
| 2003/0161195 A1 * | 8/2003 | Zonca et al. ............... 365/200 |
| 2003/0185047 A1 * | 10/2003 | Khouri et al. ............... 365/163 |
| 2003/0214856 A1 | 11/2003 | Pellizzer et al. |
| 2003/0219924 A1 | 11/2003 | Bez et al. |
| 2003/0231530 A1 * | 12/2003 | Bez et al. ................... 365/200 |
| 2004/0051094 A1 * | 3/2004 | Ooishi ......................... 257/5 |
| 2004/0085861 A1 | 5/2004 | Hamann et al. |
| 2004/0188668 A1 * | 9/2004 | Hamann et al. ............... 257/2 |
| 2004/0188735 A1 * | 9/2004 | Hideki ....................... 257/295 |
| 2004/0188868 A1 | 9/2004 | Hamann et al. |

* cited by examiner

INDIRECT SWITCHING AND SENSING OF PHASE CHANGE MEMORY CELLS

BACKGROUND OF THE INVENTION

1. Field of the Invention

The invention generally relates to integrated circuit technologies, and more particularly to phase change memory elements incorporated in integrated circuit memory devices.

2. Description of the Related Art

Phase change memory devices incorporate a material that undergoes a phase change under an external stimulus such as heat. The phase change is associated with a change in a physical or electrical property that can be measured to indicate the phase of the material. These phase change memory devices are comprised of cells of varying complexity arranged in various architectures such as crosspoint arrays. All phase change memory devices, regardless of layout and architecture, rely on measurement of the phase change to indicate memory storage. An example of phase change memory compatible with crosspoint architecture is taught in U.S. Pat. No. 6,579,760 (issued to Lung), the complete disclosure of which is herein incorporate by reference.

Phase change materials (PCM) come in many forms. For example, certain materials can be switched between two states of different electrical conductivity by changing their crystallographic state which can be achieved by heating the phase change material. A conventional approach is to detect the phase change through measurements of the resistance change that accompanies the phase change.

Switching may be accomplished by direct heating, as taught by U.S. Pat. No. 5,825,046 (issued to Czubatyj et al.) and U.S. Pat. No. 6,087,674 (issued to Ovshinsky et al.), the complete disclosures of which are herein incorporated by reference. This can be achieved by passing a high current through the PCM. Reading or sensing the state of the PCM is accomplished by passing a lower current also directly through the PCM. Moreover, direct switching requires large current densities in the PCM which subjects the PCM to significant stress. As such, the limited number of switching cycles may be a drawback of phase change memory devices, wherein the failure mechanisms are accelerated by the high current densities.

However, while the above-referenced U.S. patents and other conventional approaches disclose embodiments that were satisfactory for the purposes for which they were intended, there remains a need for a novel phase change memory architecture that eliminates the requirement of high currents to pass through the incorporated phase change materials.

SUMMARY OF THE INVENTION

In view of the foregoing, an embodiment of the invention provides a memory cell comprising a phase change material; a heating element in thermal contact with the phase change material, wherein the heating element is adapted to induce a phase change in the phase change material; and electrical lines configured to pass current through the heating element, wherein the phase change material and the heating element are arranged in a configuration other than being electrically connected in series.

According to an embodiment of the invention, the heating element is in a direct electrical path between the electrical lines, wherein the phase change material surrounds side portions of the heating element. In another embodiment, at least a part of a length of the heating element and the phase change material are electrically connected in parallel between the electrical lines. In another configuration, the heating element and the phase change material are electrically isolated from each other. Additionally, the change in phase of the phase change material is detected by direct electrical measurement of the change in electrical resistance of the memory cell.

The memory cell further comprises a sensing element in thermal contact with the phase change material, wherein the sensing element is adapted to detect a change in at least one physical property of the phase change material, wherein the sensing element is adapted to detect a change in a thermal conductivity of the phase change material. In one configuration, the sensing element comprises a diode. In another configuration the diode comprises a Schottky diode. Another configuration provides that the sensing element comprises a thermometer or the sensing element comprises at least one of a thermistor, a thermocouple, and a thermal resistor. Moreover, the heating element and the sensing element comprise a same structure.

According to an embodiment of the invention, the phase change material comprises at least one of germanium, antimony, tellurium, selenium, polonium, indium, arsenic, silver, gold, sulfur, tin, and lead. The phase change material comprises a dopant material comprising at least one of carbon, oxygen, nitrogen, and tin, wherein the dopant material comprises a dopant concentration between 0.01 and 30%. The memory cell further comprises a body portion; and a pore structure within the body portion, wherein the pore structure comprises the heating element, wherein portions of the heating element are connected to the electrical lines, wherein portions of the heating element unconnected to the electrical lines are surrounded by the phase change material, wherein the phase change material is configured on sidewalls of the pore structure, and wherein the heating element and the sensing element are configured in a center of the pore structure. Additionally, according to one embodiment, the heating element and the sensing element are configured in a pillar structure, wherein the phase change material is configured over the pillar structure. Furthermore, the memory cell is configured into a crosspoint memory array architecture according to an embodiment of the invention.

Another aspect of the invention provides a method of manufacturing a memory cell, wherein the method comprises forming a phase change material; forming a heating element to be in thermal contact with the phase change material, wherein the heating element is adapted to induce a phase change in the phase change material; and configuring electrical lines to pass current through the heating element, wherein in the step of forming the heating element, the phase change material and the heating element are arranged in a configuration other than being electrically connected in series.

In one embodiment, in the step of forming the heating element, the heating element is formed in a direct electrical path between the electrical lines, and the phase change material is formed to surround side portions of the heating element. In another embodiment, in the step of forming the heating element, at least a part of a length of the heating element and the phase change material are electrically connected in parallel between the electrical lines. Another embodiment provides that in the step of forming the heating element, the heating element and the phase change material are electrically isolated from each other. In the step of configuring, the change in phase of the phase change material is detected by direct electrical measurement of the change in electrical resistance of the memory cell.

The method further comprises forming a sensing element in thermal contact with the phase change material, wherein the sensing element is adapted to detect a change in at least one physical property of the phase change material, and wherein in the step of forming the sensing element, the sensing element is adapted to detect a change in a thermal conductivity of the phase change material. According to a one embodiment, in the step of forming the sensing element, the sensing element comprises a diode, wherein the diode comprises a Schottky diode. Additionally, in other embodiments, in the step of forming the sensing element, the sensing element comprises a thermometer, or at least one of a thermistor, a thermocouple, and a thermal resistor. Moreover, the heating element and the sensing element are formed into a same structure.

Furthermore, in the step of forming the phase change material, the phase change material comprises at least one of germanium, antimony, tellurium, selenium, polonium, indium, arsenic, silver, gold, sulfur, tin, and lead, and the phase change material comprises a dopant material comprising at least one of carbon, oxygen, nitrogen, and tin, wherein the dopant material comprises a dopant concentration between 0.01 and 30%. The method further comprises forming a body portion; and forming a pore structure within the body portion, wherein the pore structure comprises the heating element, wherein portions of the heating element are connected to the electrical lines, and wherein portions of the heating element unconnected to the electrical lines are surrounded by the phase change material. In the step of forming the pore structure, the pore structure is formed of the sensing element, the phase change material, and an insulating layer adjacent to sidewalls of the pore structure. Furthermore, the method comprises configuring the heating element and the sensing element into a pillar structure; configuring the phase change material over the pillar structure; and configuring the memory cell into a crosspoint memory array architecture.

Still another aspect of the invention provides a method of indirectly switching and sensing phase change memory cells, wherein the method comprises contacting a heating element with a phase change material; sending electrical current through the heating element; and inducing a phase change in the phase change material, wherein in the step of contacting, the phase change material and the heating element are arranged in a configuration other than being electrically connected in series.

The method further comprises detecting the change in phase of the phase change material by direct electrical measurement of the change in electrical resistance of the memory cell, and contacting a sensing element with the phase change material, wherein the sensing element is adapted to detect a change in at least one physical property of the phase change material. The method further comprises forming a pore structure within a body portion of the memory cell, wherein the pore structure comprises the heating element, wherein portions of the heating element are connected to electrical lines carrying the electrical current, and wherein portions of the heating element unconnected to the electrical lines are surrounded by the phase change material, wherein in the step of forming, the pore structure is formed by depositing the phase change material on sidewalls of the pore structure, and wherein the heating element and the sensing element are deposited in a center of the pore structure. Furthermore, the method comprises configuring the heating element and the sensing element into a pillar structure and configuring the phase change material over the pillar structure. In one embodiment, the invention comprises configuring the memory cell into a crosspoint memory array architecture.

An embodiment of the invention provides techniques for indirectly switching and detecting the phase of a PCM in a memory cell. That is, the PCM is not in the direct electrical signal path. Additionally, an embodiment of the invention provides an alternative direct sensing method with enhanced sensitivity. In addition to a change in electrical resistance, there is a change in thermal conductivity associated with the phase change of the PCM. This change in the thermal conductivity can be substantial. For example, for $Ge_2Sb_2Te_5$, this change is nearly an order of magnitude. The change in thermal conductivity affects the amount of heat that flows away from a heater which is in contact with the PCM. Thus, the temperature of the heater after a known amount of energy is dissipated in the heater is an indication of the phase of the PCM. This is achieved by incorporating a thermometer into the heater in contact with or surrounded by the PCM. Heat is supplied to the heater directly (i.e. by passing a current through the object) or indirectly. Suitable thermometers include a thermocouple, an electronic diode such as a p-n junction or Schottky diode, or a metal with a known temperature coefficient of resistance.

An advantage of an embodiment of the invention's indirect method of detecting the state of the PCM is that the PCM is not subjected to the stress associated with the high current densities required to apply heat and/or measure the temperature of the PCM. These high currents can cause degradation of the materials in the PCM by electromigration which causes memory failure and limits the useable lifetime of the memory cell. A further advantage is that the same structure is used for both switching (heating) the PCM and sensing (reading) the state of the PCM.

These and other aspects of the embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
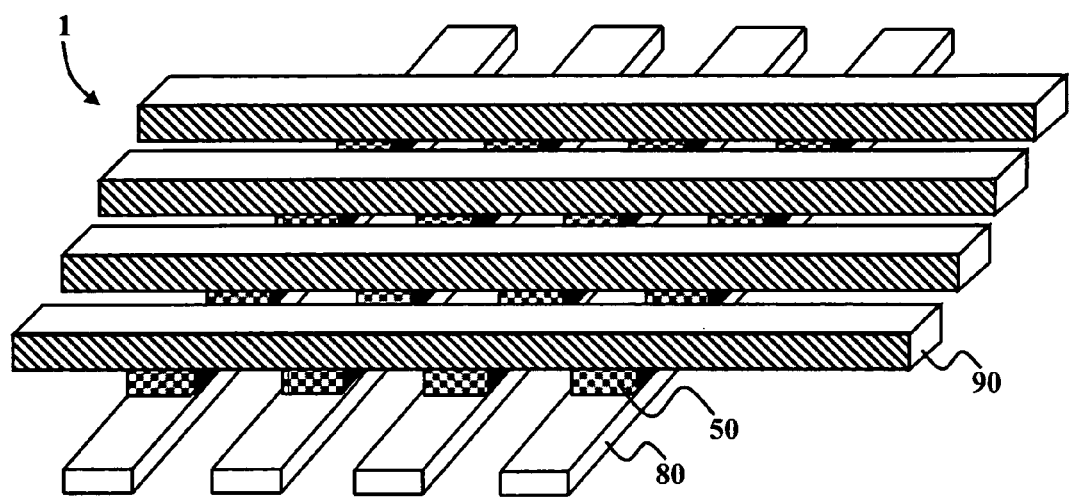
FIG. 1 is a schematic diagram of a patterned phase change memory architecture.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel phase change memory architecture that eliminates the need for high currents to pass through the incorporated phase change materials. In order to address this need, an embodiment of the invention provides a phase change memory architecture that eliminates the need for high currents passing through the PCM. According to an embodiment of the invention, switching is achieved by passing current through an adjacent heater from which heat passes into the PCM by thermal conduction. Moreover, sensing (reading) is achieved by applying a smaller amount of heat to the PCM and measuring the temperature change rather than the resistance change of the PCM. Furthermore, an alternative sensing method is provided which is direct but achieves a greater sensitivity by localizing the path of the sense current to the region of the PCM in the memory cell which is most sensitive to the indirect switching method. Referring now to the drawings, and more particularly to FIGS. 1 through 22, there are shown preferred embodiments of the invention.

According to an embodiment of the invention, an example of a crosspoint memory cell architecture 1 is shown in FIG. 1. The memory architecture 1 of FIG. 1 is convenient for the description of the indirect heating and sensing method provided by an embodiment of the invention, and described below, but the indirect sensing method can be applied to other architectures of phase change memory such as PCM memory cells available from Ovonyx®, Inc., Idaho, USA, as well as other architectures. As shown in FIG. 1, a detector/heater stack 50 comprising a phase change material is placed at each crosspoint intersection of an upper 90 and lower 80 interconnect level.

As such, an embodiment of the invention may be implemented in a crosspoint array architecture 1 where the top and bottom of an array of pores (detector/heater stack) 50 are contacted by orthogonal wiring layers 80, 90 as shown in FIG. 1. However, the several embodiments of the invention are equally applicable to other architectures where individual pores can be addressed (i.e. written to and read from electronically). Examples include a dynamic random access memory (DRAM) architecture and its variants. Here, the pores assume the place of the capacitor in a DRAM circuit and is accessed by a transistor to which the pore is connected electronically. The transistor is connected to two control wires conventionally called the bit line and the word line arranged in two layers of orthogonal wires.

Figure 17:
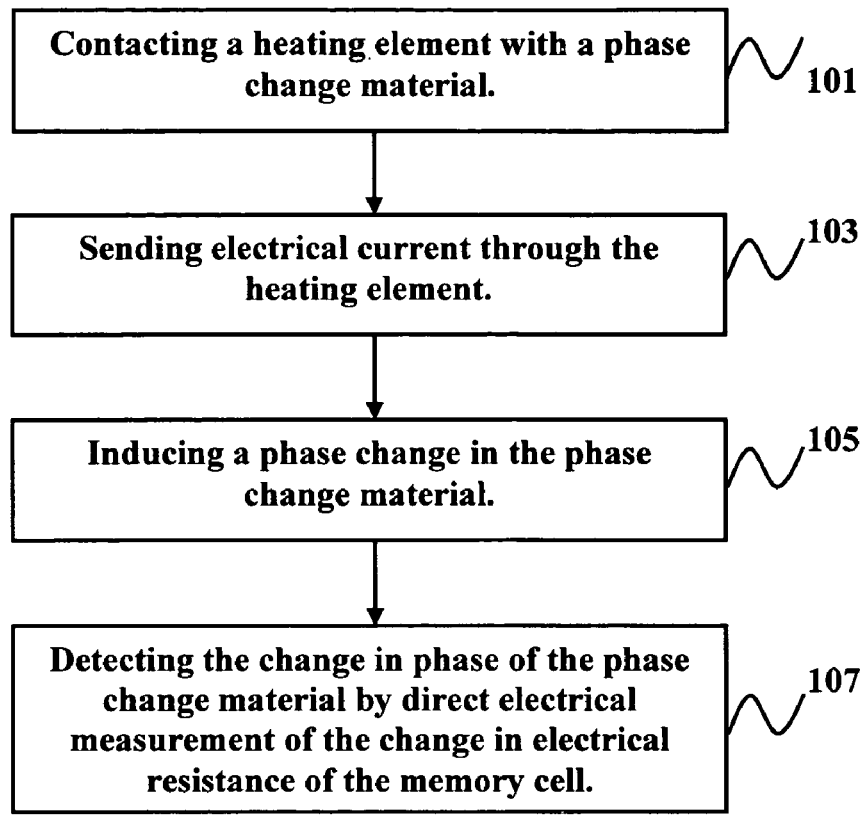
FIG. 17 is a flow diagram illustrating a preferred method of the invention.

The manufacturing of the detector/heater stack 50 together with the upper 90 and lower 80 interconnect levels are illustrated sequentially in FIGS. 2 through 13, FIGS. 18 through 22 (illustrating an alternate embodiment), with the general methodology shown in the flowchart of FIG. 17. As first illustrated in FIG. 2, the lower level of wires (collectively) 80 can be fabricated on any convenient substrate 10 that is smooth and available such as silicon nitride, silicon dioxide, or other non-conductive materials including dielectric materials. Thereafter, a thin layer of titanium nitride 15 or other similar material is deposited over the substrate 10. Next, a layer of nickel 20 or other similar conductive material is deposited over the titanium nitride 15. Then, a thick layer of N-type amorphous silicon 25 is deposited over the nickel layer 20. A thin layer of silicon nitride 30 is then deposited over the N-type amorphous silicon layer 25. Layers 15, 20, and 25 collectively form the lower level of wires 80.

It is desirable that the wires 80 be thermally insulated from the substrate 10 by a thermal insulating material (not shown) deposited in thin film form (approximately 1 micron) onto the substrate 10. Silicon dioxide and polyimide are examples of such a thermal insulating material. Layers 20 and 25 of the lower wire 80 may be fabricated from any of the highly conductive metals commonly used in microelectronics manufacturing other than those described above. These include, aluminum, tungsten, and copper, and their alloys. A highly doped semiconductor could also be used. Typically the wire 80 is less than approximately 500 nm wide and may be fabricated in a conventional manner such as patterning of a blanket film by etching or lift-off or the damascene processing of a chemical vapor deposition (CVD) or physical vapor deposition (PVD) or up-plated metal.

Figure 3:
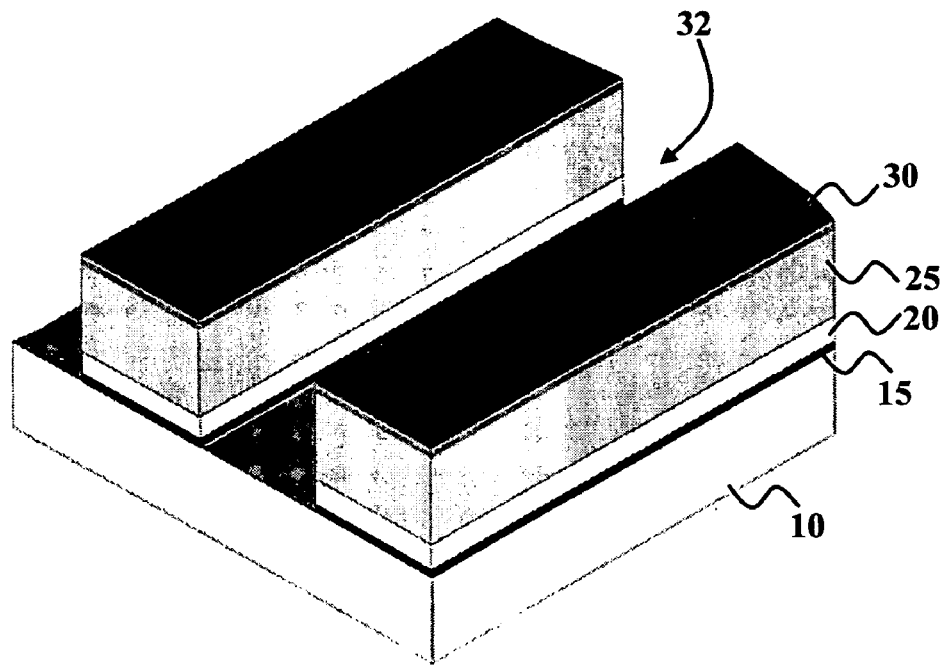
Figure 4:
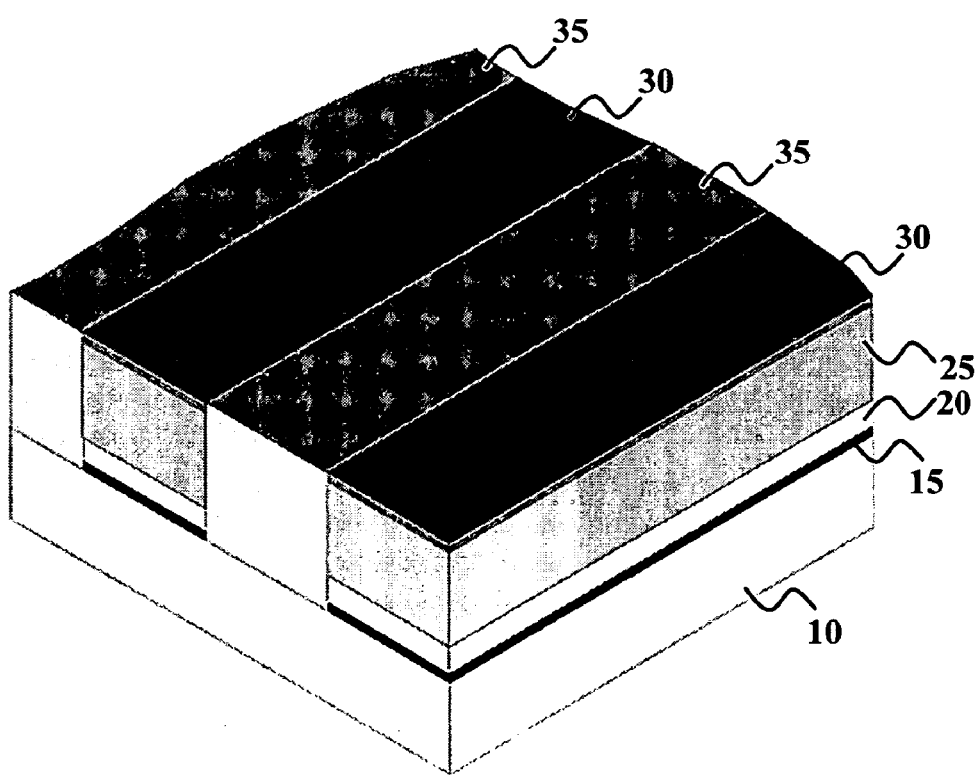

As shown in FIG. 3, portions of the wire 80 are removed using a typical photolithography mask and a subsequent reactive ion etching process to create gaps 32 in the wire 80, which will eventually form an interconnect structure. Thereafter, as illustrated in FIG. 4, an oxide layer 35 comprising silicon nitride, silicon dioxide, or other non-conductive materials including dielectric materials, is deposited in the gaps 32 using plasma enhanced chemical vapor deposition (PECVD). A chemical mechanical polishing (CMP) process is then performed to planarize the interconnect structure by removing any oxide 35 from above the silicon nitride layer 30. While a planarized configuration is desirable, an unplanarized configuration can also be used.

Figure 14:
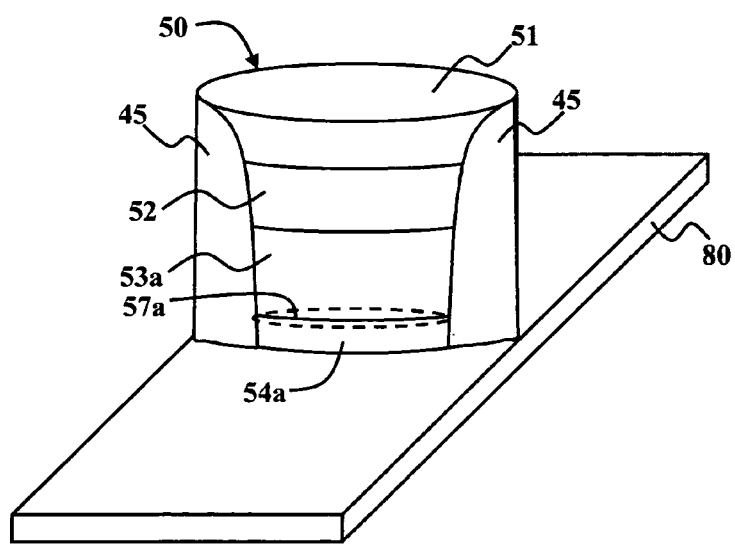
FIGS. 14 and 15 are schematic diagrams of a switched phase change memory cell according to an embodiment of the invention.
Figure 15:
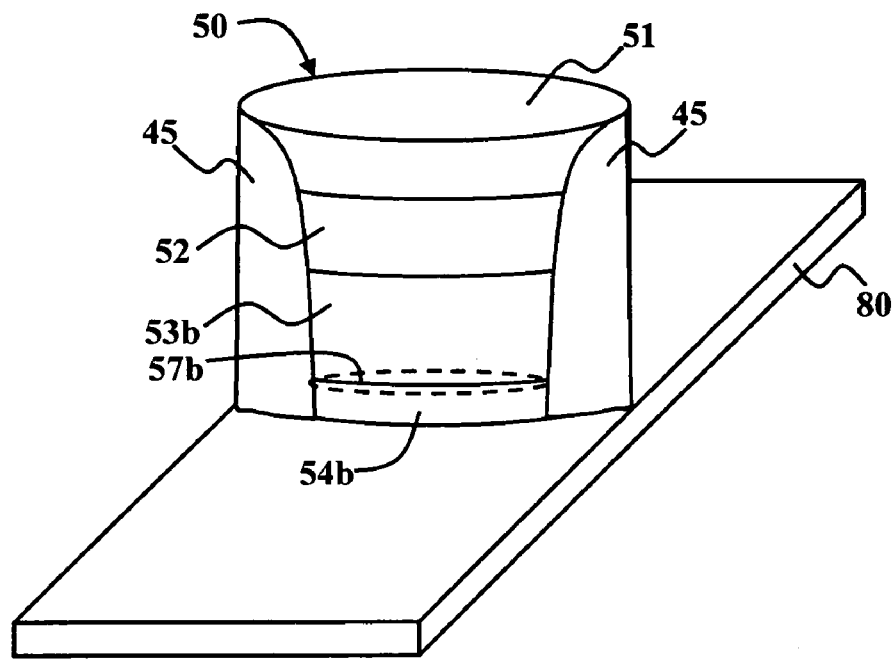
Figure 16:
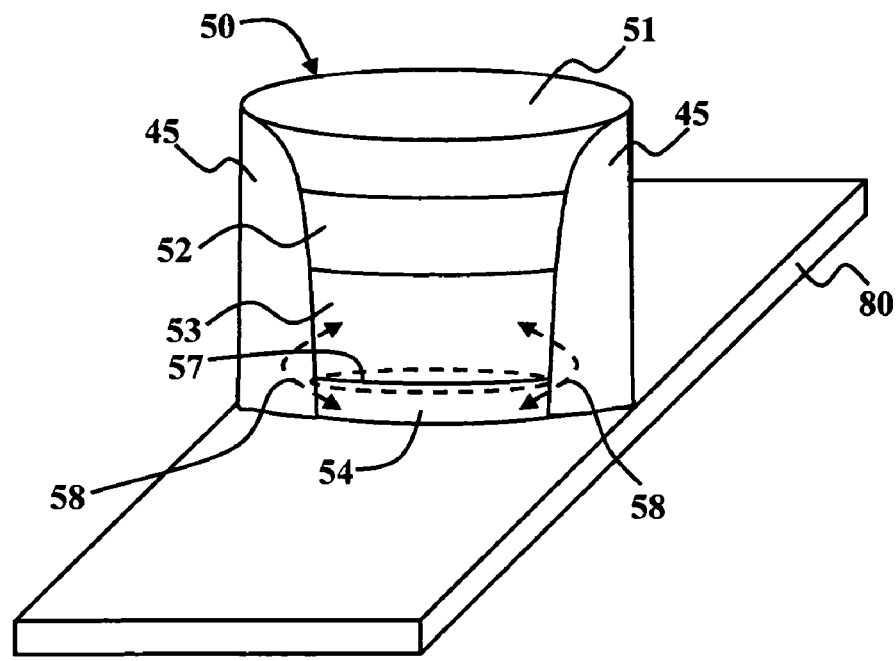
FIG. 16 is a schematic diagram of a switched phase change memory cell illustrating the current leakage path around the diode junction according to an embodiment of the invention.

The pore-filling structures (detector/heater) 50 shown in FIGS. 14 through 16 are fabricated in a thermally insulating via layer; interlayer dielectric (ILD), which is not shown for clarity in these figures. There are various methods for fabricating such a structure. The following methods provide two alternative approaches. Either the pore is first defined in the ILD which is then backfilled with the appropriate materials, or a blanket series of films containing these same materials is deposited which is then defined into a small pillar structure and then covered in the ILD. The first method is illustrated in FIGS. 5 through 10. The second method is described in FIGS. 18 through 22.

Figure 5:
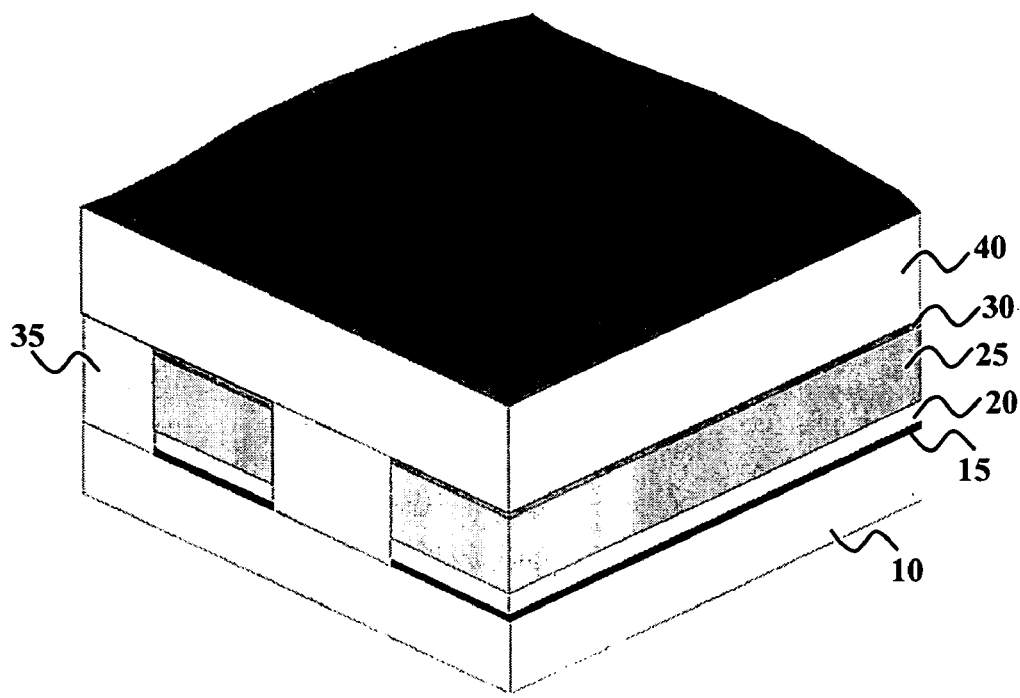
Figure 6:
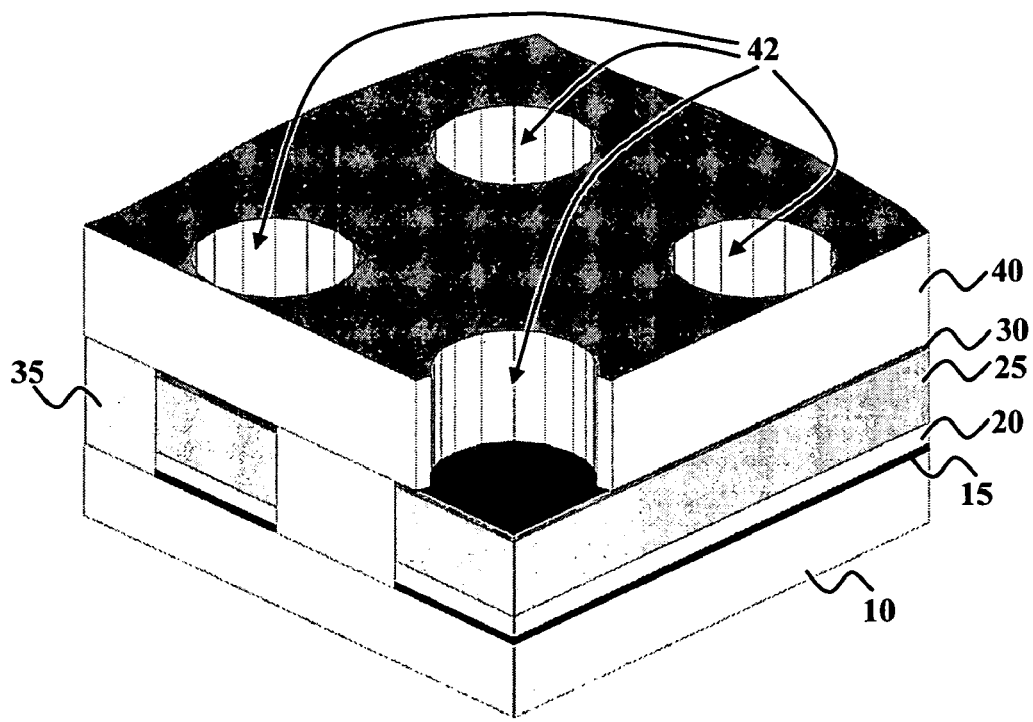

In FIG. 5, an ILD 40 is deposited as a continuous film over the bottom wire 80 and the oxide layer 35. The thickness of the ILD 40 defines the height of the resulting structure, which can be up to 1 micron with 100 nm being a preferred thickness. A via mask (not shown) is then used to define the position of the vias (pores) 42, shown in FIG. 6, which are configured in the ILD 40 and over the bottom level of interconnects 80. The mask can be defined by any one of a number of lithographic methods into a thin (approximately the thickness of the ILD layer) layer of photoresist material. The diameter of the pores 42 will match that of the size of the individual wires of the lower interconnect layer 80 although an exact match is not necessary. The size can vary from the smallest dimensions (a few nm) up to microns in size. A reactive ion etch (RIE) is used to remove the ILD material 40 beneath the area of the mask opening thereby exposing the underlying silicon nitride layer 30. In other words, the etch is designed to stop when it reaches the top of the interconnect wiring layer 80, which is shown as the thin (approximately 10 nm) etch stop silicon nitride layer 30, although any other material can be used where there is good etch selectivity to the chemistry used to remove the ILD material 40.

Figure 7:
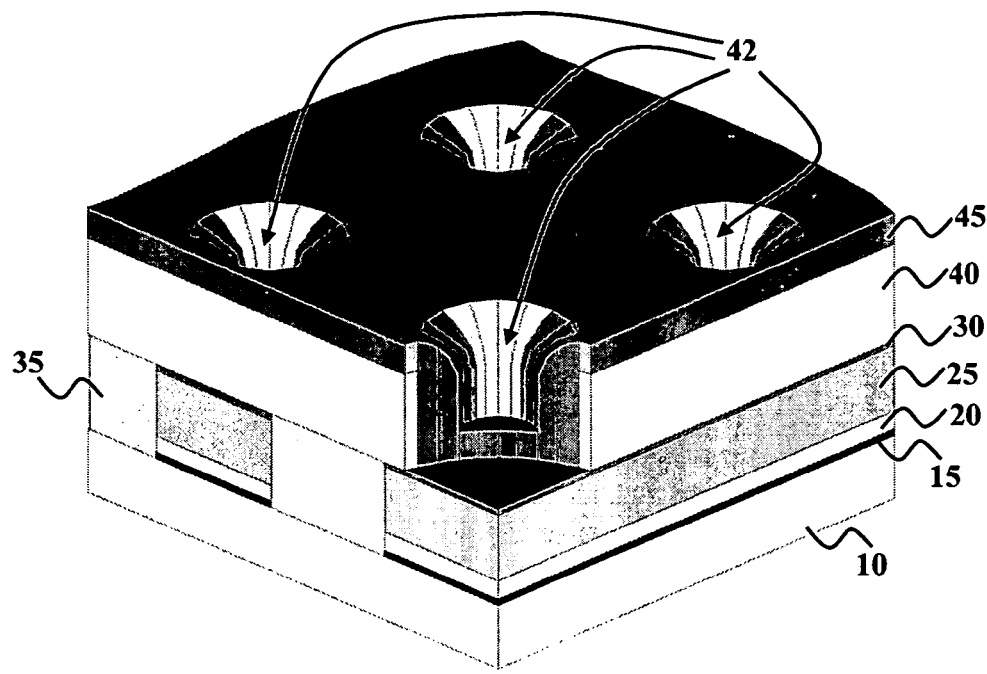

A spacer phase change material (PCM) 45 is then deposited in the pores 42 and over the exposed ILD material 40 as illustrated in FIG. 7. The PCM 45 may be any one of a number of phase change materials having the property of a change in the thermal conductivity between two solid state phases. Examples of such phase change materials are materials which comprise of at least one of the elements germanium, antimony, tellurium, indium, arsenic, silver, sulfur, polonium and selenium. These materials may further contain dopants of up to 30% of a further element such as carbon, nitrogen, tin, or oxygen. A thickness of the deposited PCM 45 of up to approximately 33% of the diameter of the pore 42 is desirable.

Figure 8:
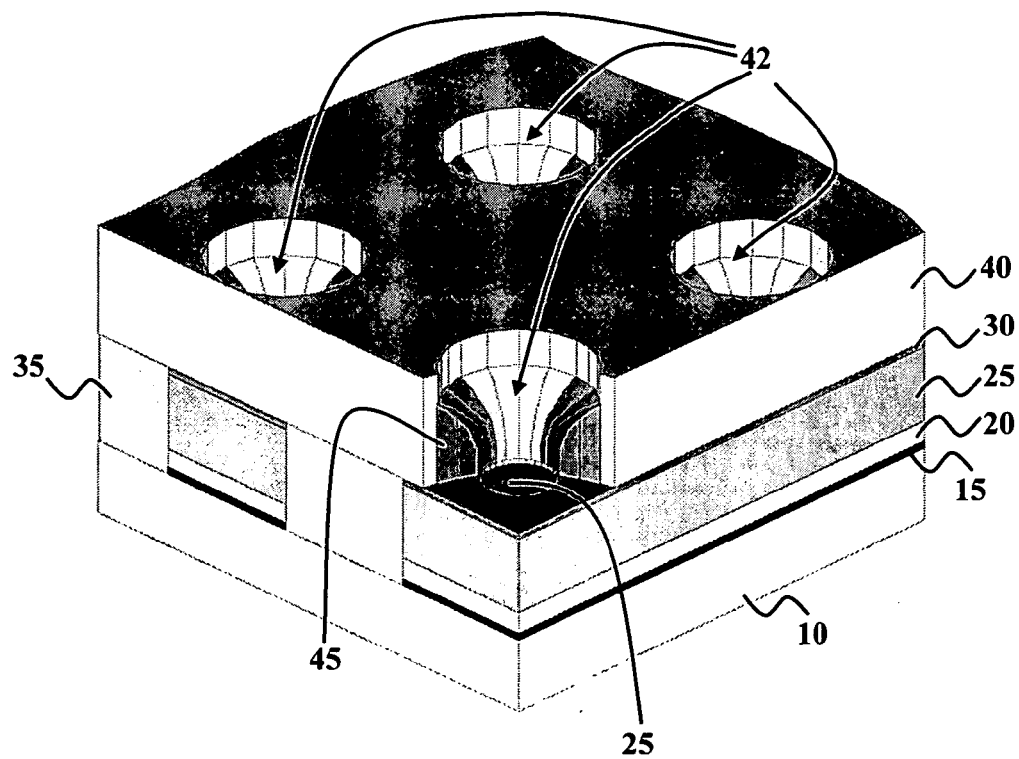

Then, as shown in FIG. 8 a timed etching process is performed which etches the horizontal surfaces of the structure thereby removing the PCM 45 over the ILD material 40 including the PCM 45 at the bottom of the via 42 to reveal the etch stop layer 30 on top of the lower interconnect level 80. The etch stop layer 30 is then removed by a short breakthrough etch to expose the top layer (N-type amorphous silicon layer) 25 of the lower interconnect wires 80. The formation of the spacer 45 will typically be followed by the deposition of a thin (approximately 5–10 nm) barrier layer (not shown) which will stop the diffusion and intermixing of the PCM material 45 with the detector/heater structure 50. The barrier layer is then removed from the bottom of the pore 42 by an etching process.

As such, the interior sidewall of the pore 42 is covered with a thin (approximately 25% of the pore diameter) film spacer of the PCM material 45. The spacer 45 can be uniform in thickness as if deposited by a CVD technique or thicker towards the bottom of the pore 42 (as shown in the FIG. 7), which will be the result of a physical vapor deposition such as sputtering or evaporation. Again, the top of the PCM spacer layer 45 may comprise a thin (approximately 5–10 nm) layer of an adhesion layer or diffusion barrier (not shown) or the metal used in the lower interconnect level 80.

Figure 9:
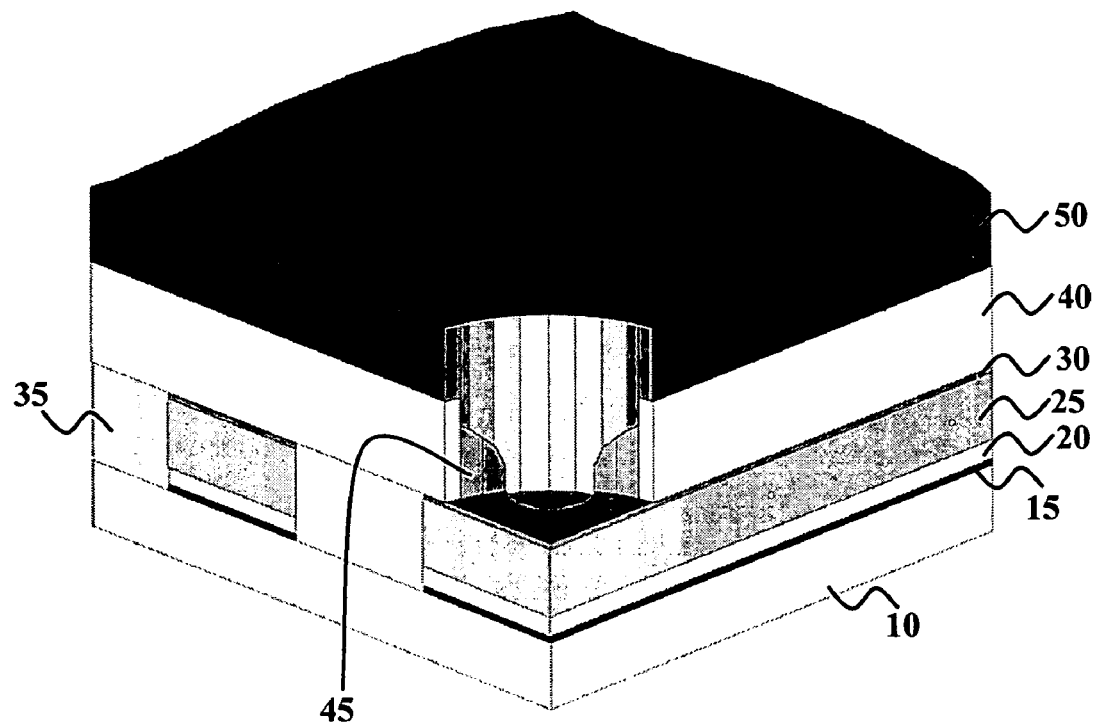

As illustrated in FIG. 9 and further shown in FIGS. 14 through 15, the next step is the deposition of the detector/heater element materials 50. Generally, these detector/heater materials 50 comprise several different thin films deposited (by chemical or physical methods) to form good electrical contact with the metal interconnect level 80, the sensing element (diode 53a/54a or thermocouple 53b), and a top layer 51 to provide good contact to the upper interconnect level 90 (shown in FIG. 1). This series of layers is shown as a single layer 50 in FIGS. 9 through 13 and FIGS. 18 through 22 with the individual layers shown in FIGS. 14 through 16.

The pore-filling structures (detector/heater) 50 shown in FIGS. 14 through 16 may alternatively be fabricated by a method that involves the fabrication of pillars 67 (shown in FIGS. 18 through 22) of heater/detector material 50 that are covered by PCM 45, rather than filling the pores 42. The sequence for this approach is identical to that described above up for the first embodiment until the structure of FIG. 5. In this second embodiment (FIGS. 18 through 22), the top layer of the structure comprises the heater/detector material 50 rather than the IDL material 40 of the first embodiment (FIGS. 5 through 10).

Figure 18:
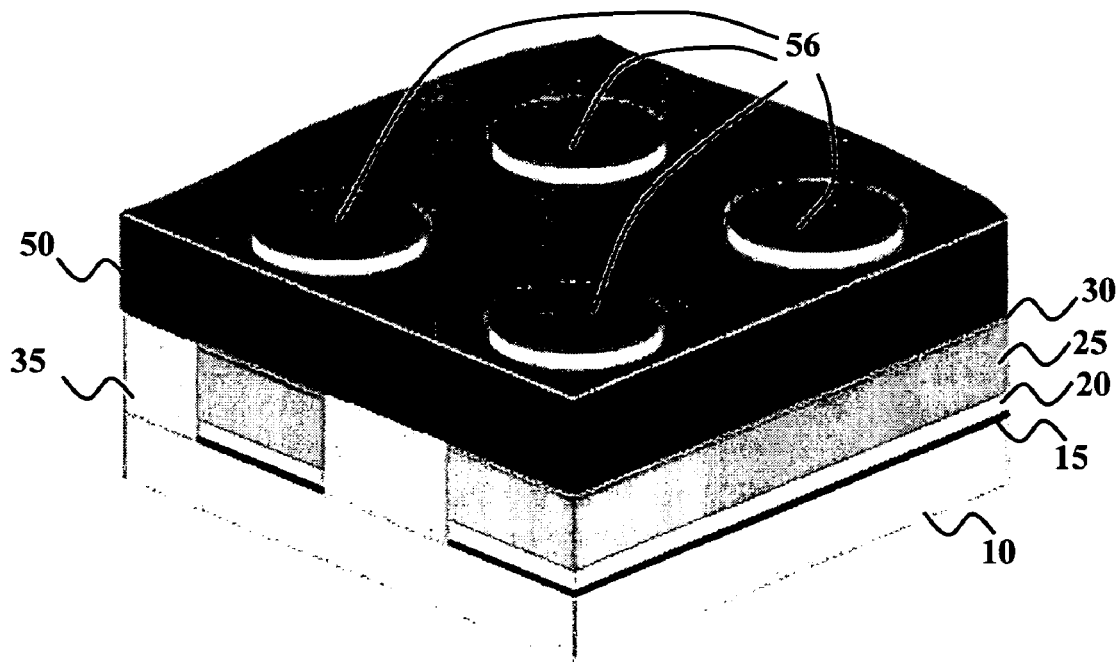
FIGS. 18 through 22 are schematic diagrams illustrating intermediate processing steps of a phase change memory cell according to an alternate embodiment of the invention.
Figure 19:
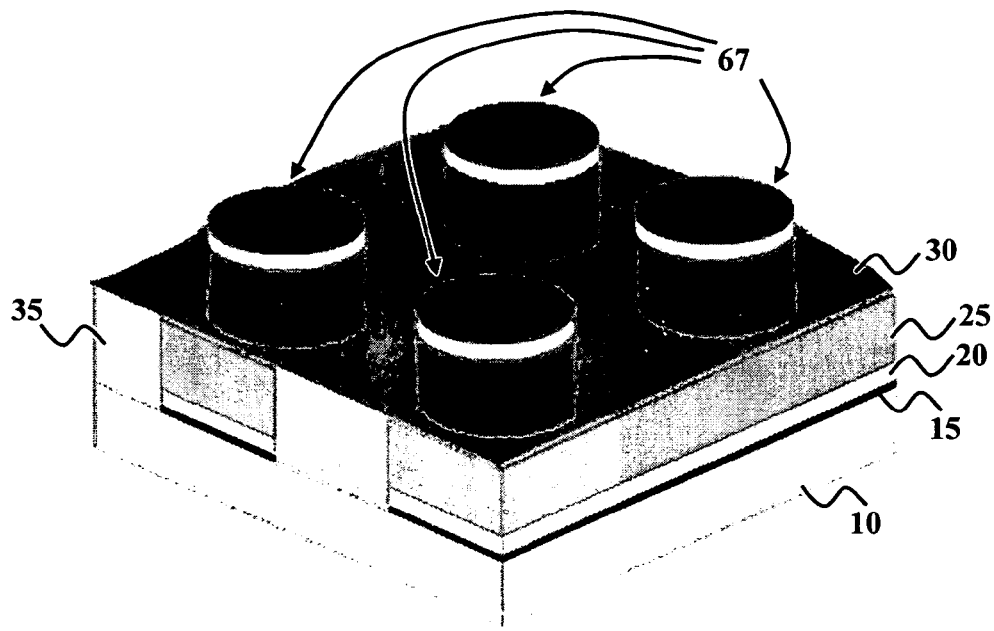

In the second embodiment, instead of making pores 42 into the structure, a mask 56 is added to facilitate an etch or mill step that creates pillars 67. The mask material could be a metal such as chrome, or a negative resist such as hydrogen-silsesquioxane (HSQ), which would be patterned over the continuous film. The resist acts as a hard mask in the formation of the wires, and then is removed. The structure together with the mask 56 is illustrated in FIG. 18. The resulting pillars 67 are illustrated in FIG. 19 after the excess heater/detector material 50 is removed from areas unprotected by the mask 56.

Figure 20:
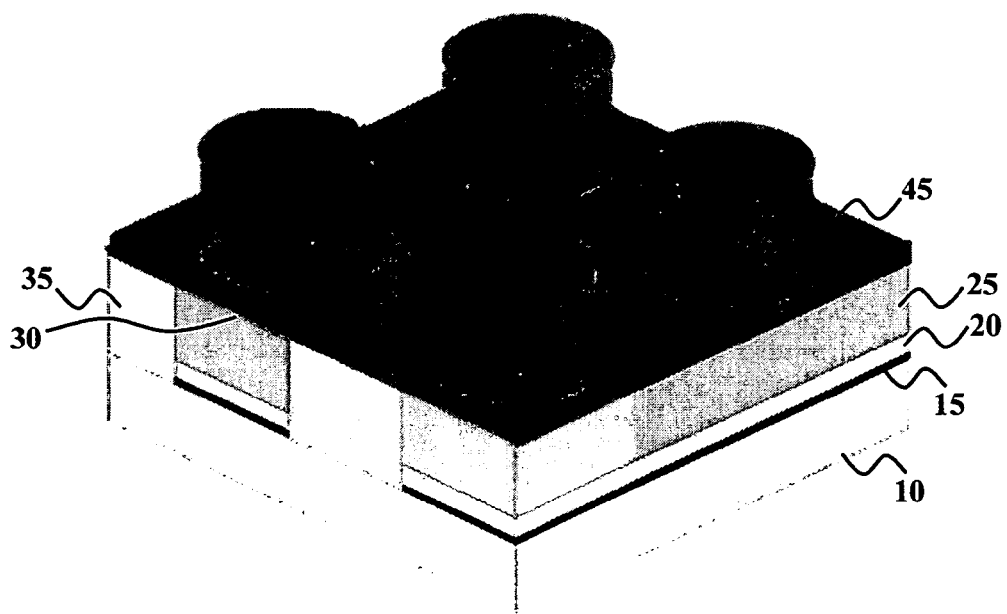
Figure 21:
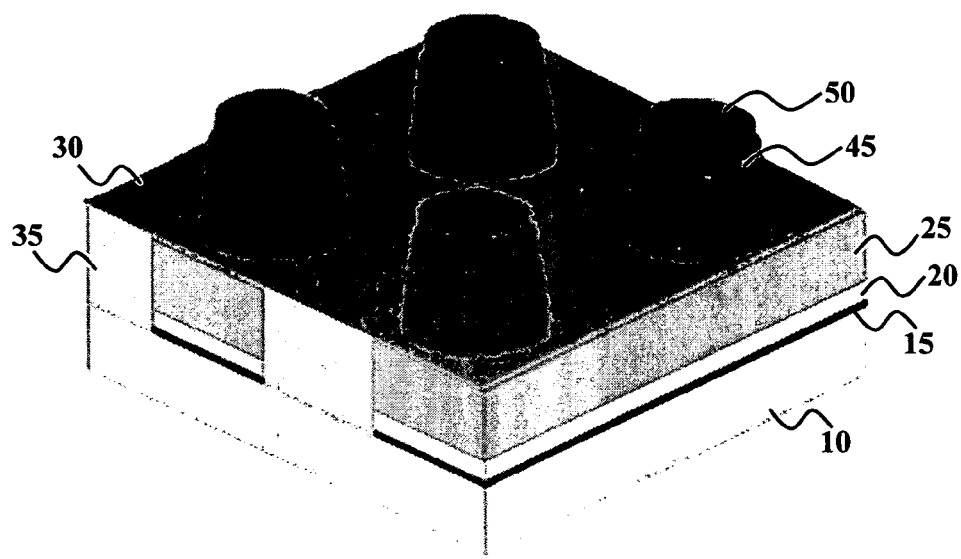
Figure 22:
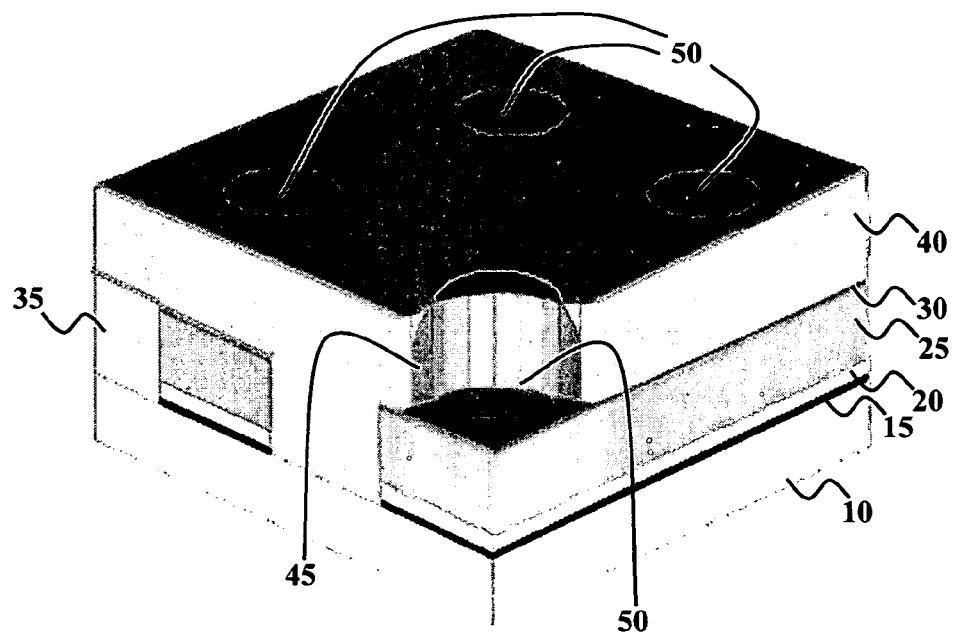

After removal of the mask material 56, PCM 45 is deposited onto the entire surface, as shown in FIG. 20. For example, the deposition may occur by PVD or by ion beam deposition (IBD). The thickness of the PCM 45 is similar to that described for FIG. 7 above, except that in this case the PCM 45 is deposited on the outside of the pillar 67 rather than into the pore 42 (shown in FIG. 7). Then, as with the etching of the pore structure of FIG. 8, a timed etching process is performed that etches the horizontal surfaces of the structure of FIG. 21, thereby removing the PCM 45 over the ILD material 40 to reveal the underlying etch stop layer 30 on top of the lower interconnect level 80. Moreover, the PCM 45 is also removed from the tops of the pillars 67, leaving the structure as illustrated in FIG. 21.

Figure 11:
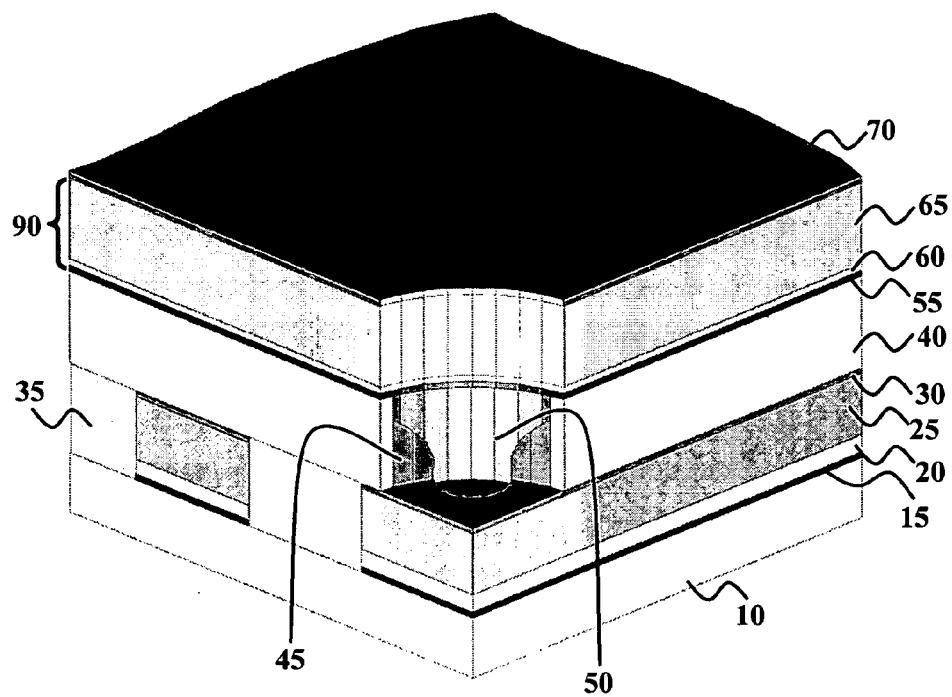
Figure 12:
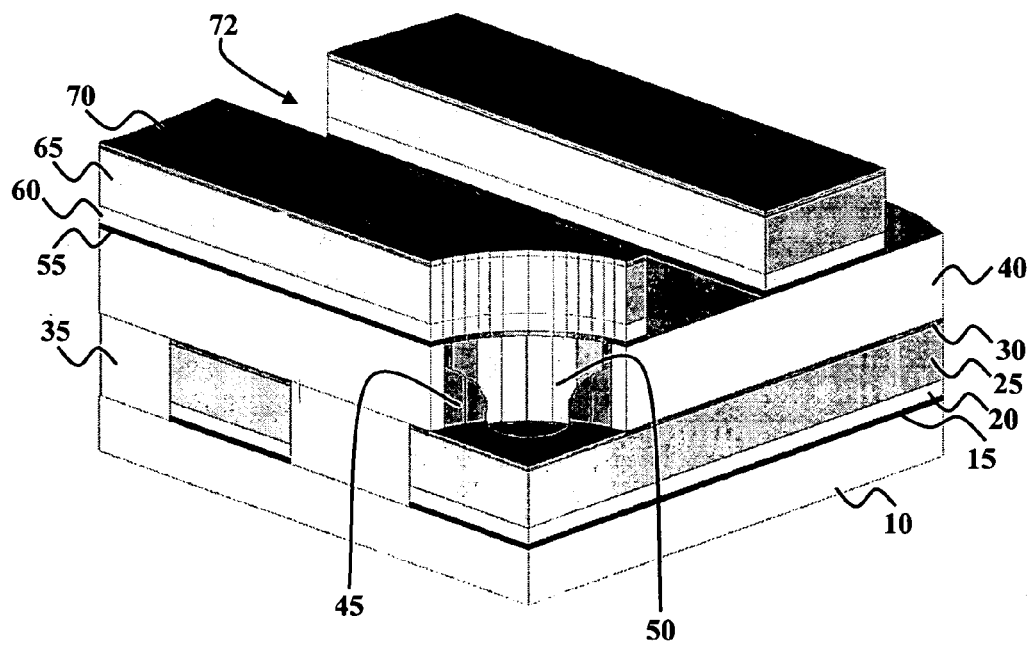
Figure 13:
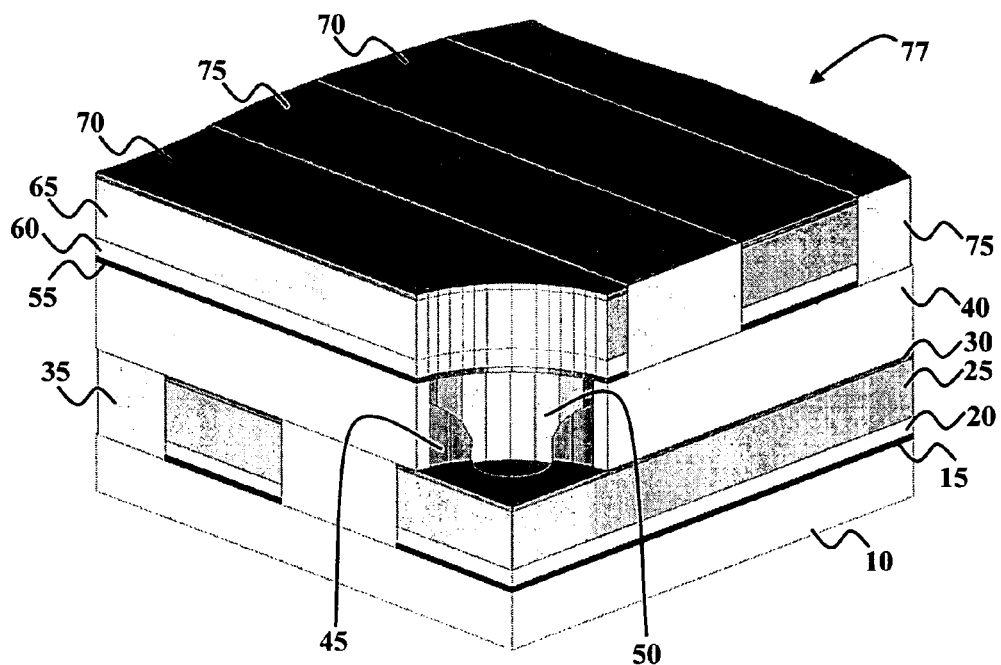

Next, the remaining pillar structures 67 are encapsulated in ILD 40 by a blanket deposition process. Finally, the surface is planarized to yield the structure illustrated in FIG. 22. The remaining steps, those illustrated by FIGS. 11 through 13, are unchanged for this alternate approach. However, the resulting structures of FIGS. 10 and 22, differ slightly in the contour of the PCM 45 near the top of the pore 42 (FIG. 10) and the heater pillar 67 (FIG. 22), respectively.

The detector/heater structure 50 is designed to measure the temperature of the pore 42 when a given amount of power is deposited in the pore 42. There are several suitable electronic structures that have a suitable characteristic where the current through (or voltage across) is a sensitive function of temperature. A preferred embodiment shown in FIG. 14 comprises a semiconductor diode 53a/54a where the current through the diode 53a/54a is an exponential function of temperature. Such a diode 53a/54a may be formed by the junction 57a of a metal 54a (such as aluminum, tungsten, platinum, palladium, among others) and a semiconductor 53a (such as silicon) which has been doped with a standard dopant (such as phosphorus, boron, or arsenic) to make it a "n" or "p" type semiconductor. Alternatively, a semiconductor p-n junction can be formed between films of silicon with p doping and a film of silicon with n doping. These materials are deposited sequentially over the entire pore structure 42 to form the diode structure (53a/54a). Typical film thicknesses range from 10 nm for the metal layers 51, 54a to 20–50 nm for the semiconductor layer 53a. The total thickness of the bottom diode layer 54a is preferably 5–10 nm and less than the depth of the pore 42 to allow for the top contact metal 51 to be deposited in a planarized fashion.

A second preferred embodiment of the detector stack 50 is shown in FIG. 15 which includes the deposition of a thermocouple, thermistor, or thermal resistor 53b instead of a diode 53a/54a (shown in FIG. 14). Common materials suitable for the thermocouple 53b include materials such as polysilicon which have been doped, vanadium oxide, and a junction 57b between metals 54b such as tungsten, platinum, palladium and thermocouple reference alloys forming the thermocouple 53b. Again, thin films can be deposited by chemical and/or physical methods such that the depth of the pore 42 contains the detector element 50.

More particularly, an implementation of the modification to the memory cell 77 of FIG. 13 is shown in FIG. 14. Here, a coated pore structure, which is embodied as a detector/heater stack 50, forms the material at each crosspoint of the upper interconnect level 90 and lower interconnect level 80 shown in FIG. 1. The pore 42 is conformally coated with a PCM 45 and filled with a stack of thin film materials to form a heater/temperature sensor 50 for indirectly heating and measuring the phase of the PCM 45. For example, the stack 50 comprises a p type semiconductor such as a p type polysilicon 54a, an n type semiconductor such as an n type polysilicon 53a, topped by a thermal insulator and/or electrical resistor 52 which may be required. The p-n junction 57a forms a diode 53a/54a which acts as a heater 57 and thermometer for the cell 77. An alternative configuration uses the bottom electrode 80 as one of the contacts to a diode 53a/54a, forming a Schottky diode with the layer of semiconductor above 54a. This could be a layer of semiconductor such as polysilicon with the appropriate doping.

Alternatively, a material 53b with a significant thermal coefficient of resistance can be used to fill the pore 42 and act as the heater and temperature sensor as shown in FIG. 15. Here, the PCM 45 is used to coat the interior walls of the pore 42 and a semiconductor (polysilicon) or metallic plug is formed in the center of the pore 42. The PCM 45 wraps around the temperature sensor 50, enhancing the sensitivity of the temperature measurement. Furthermore, the thermal insulator/electrical resistor 52 may be included to confine the heat to the center of the cell 77. The structure can be made by a series of deposition steps involving techniques such as CVD or conformal PVD.

These indirect switching methods can be combined with direct sensing methods. For example, as shown in FIG. 16, the temperature in the PCM 45 is at a maximum near the junction 57 of the diode heater/detector 50 used to indirectly heat the PCM 45. In some PCMs the phase change is associated with a large change in resistance. This PCM resistance is effectively in parallel with the diode 53/54 as shown in FIG. 16. The resistance can be measured by reversing the potential applied to the diode 53/54. The current through the diode 53/54 will be low as the diode 53/54 is reverse biased. The current through the PCM 45 will dominate the reverse diode current so it can be sensed with conventional current sense amplifiers. Alternatively, the voltage can be reduced below the diode threshold voltage, which is the voltage at which the diode 53/54 begins to conduct current. This threshold voltage is approximately 1 V for silicon based diodes. Again, the current will be dominated under these low applied voltages by the current that leaks 58 (which comprises the PCM phase change region) around the diode 53/54 through the PCM 45. The phase of the PCM 45 can therefore be sensed by conventional current sense amplifiers.

An alternative configuration to that shown in FIG. 16 is to include a hollow center (not shown in the perspective view of FIG. 16) in the detector 50. This improves the thermal properties of the structure 50. It also improves the sensitivity of the direct sensing technique as the current flow through the central electrode will be reduced and hence more sensitive to leakage through the PCM 45.

Figure 2:
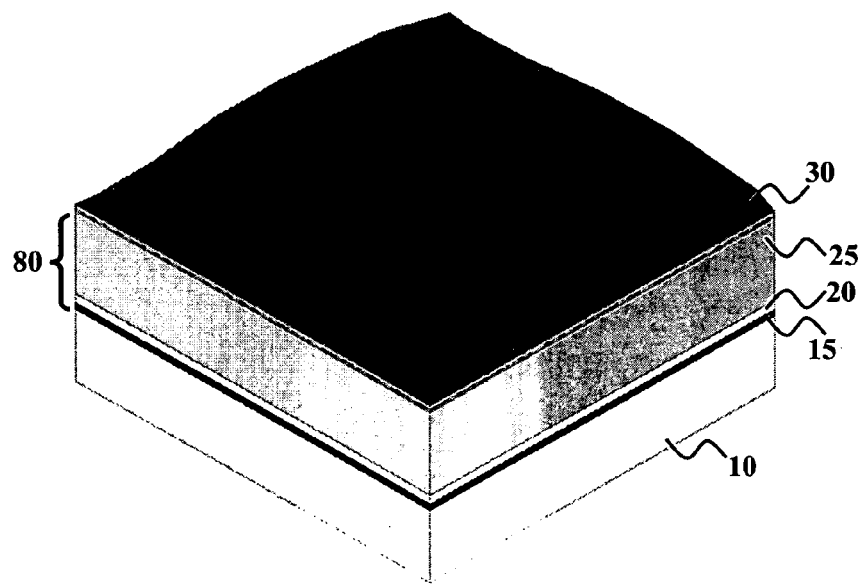
FIGS. 2 through 13 are schematic diagrams illustrating intermediate processing steps of a phase change memory cell according to an embodiment of the invention.
Figure 10:
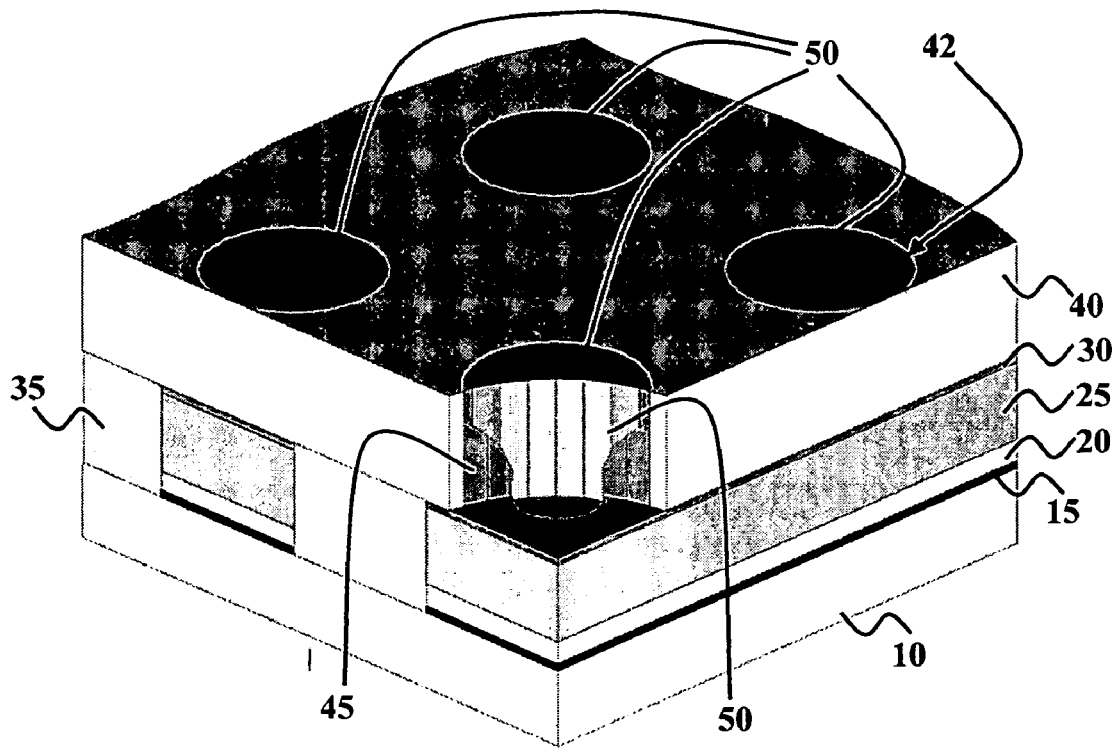

Continuing with the processing of the memory cell, the surface of the sample is then polished back to the top of the ILD layer 40 with a CMP process as shown in FIG. 10. This reveals the metal deposited on the detector/heater structure 50, but each pore 42 is isolated as the metal 50 between (connecting) the pores 42 has been removed. Thereafter, as illustrated in FIG. 11, the top interconnect wiring level 90 is then fabricated by the deposition of a series of metal and/or doped semiconductor films which are then patterned so that the wires run in a different direction (preferably orthogonal) to the lower interconnect wires 80, with the fabrication process shown in FIGS. 11 through 13 being substantially the same as the fabrication process for forming the lower interconnect wires 80 (FIGS. 2 through 4).

Generally, as shown in FIGS. 11 through 13, the formation of the upper interconnect wires 80 comprises depositing a titanium nitride layer 55 (configured similar to titanium nitride layer 15) over the planarized ILD layer 40 including the detector stack 50 contained therein. Then, a nickel layer 60 (configured similar to the nickel layer 20) is deposited over the titanium nitride layer 55. Next, a thick layer 65 of N-type amorphous silicon (configured similar to the N-type amorphous silicon layer 25) is deposited over the nickel layer 60 followed by the deposition of a silicon nitride layer 70 (configured similar to the silicon nitride layer 30) over the N-type amorphous silicon layer 65. Generally, the upper interconnect level 90 comprises the combination of layers 55, 60, and 65. After selective etching (shown in FIG. 12) to create gaps 72 in the upper interconnect level 90, a PECVD of oxide 75 is performed to fill the gaps 72, preferably followed by an overall etching to planarize the device, as shown in FIG. 13 to form the final memory cell structure 77. Thicknesses and materials for the various layers are similar to the thicknesses and materials of the respective layers in the lower interconnect level 80.

Generally, as shown in FIG. 17, an embodiment of the invention provides a method of indirectly switching and sensing phase change memory cells 77, wherein the method comprises contacting (101) a heating element 57 with a phase change material 45, sending (103) electrical current through the heating element 57, and inducing (105) a phase change in the phase change material 45, wherein the phase change material 45 and the heating element 57 are arranged in a configuration other than being electrically connected in series. In one embodiment, in the step of contacting (101), the heating element 57 is formed in a direct electrical path between electrical lines 80, 90 carrying the electrical current, and the phase change material 45 is formed to surround side portions of the heating element 57.

In another embodiment, in the step of contacting (101), at least a part of the length of the heating element 57 and the phase change material 45 are electrically connected in parallel between the electrical lines 80, 90. In yet another embodiment, in the step of contacting (101), the heating element 57 and the phase change material 45 are electrically isolated from each other.

The method further comprises detecting (107) the change in phase of the phase change material 45 by direct electrical measurement of the change in electrical resistance of the memory cell 77. Additionally, an embodiment of the invention provides an additional step of contacting a sensing element 53 with the phase change material 45, wherein the sensing element 53 is adapted to detect a change in at least one physical property of the phase change material 45, wherein in the step of contacting the sensing element 53 with the phase change material 45, the sensing element 53 is adapted to detect a change in a thermal conductivity of the phase change material 45.

In one embodiment, in the step of contacting the sensing element 53 with the phase change material 45, the sensing element 53 comprises a diode 53a/54a, wherein the diode 53a/54a comprises a Schottky diode (not shown) according to another embodiment of the invention. Additionally, an alternate embodiment provides that in the step contacting the sensing element 53 with the phase change material 45, the sensing element 53 comprises a thermometer 53 or at least one of a thermistor 53b, a thermocouple 53b, and a thermal resistor 53b. Furthermore, the heating element 57 and the sensing element 53 are formed into a same structure (collectively shown as 53/57).

Also, in the step of contacting (101) the heating element 57 with the phase change material 45, the phase change material 45 comprises at least one of germanium, antimony, tellurium, selenium, polonium, indium, arsenic, silver, gold, sulfur, tin, and lead. Another aspect of the invention provides that in the step of contacting (101) the heating element 57 with the phase change material 45, the phase change material 45 comprises a dopant material comprising at least one of carbon, oxygen, nitrogen, and tin, wherein, the dopant material comprises a dopant concentration between 0.01 and 30%.

The method further comprises forming a pore structure 42 within a body portion of the memory cell 77, wherein the pore structure 42 comprises the heating element 57, wherein portions of the heating element 57 are connected to the electrical lines 80 either directly or through the material 54 in FIG. 16 (and similarly, the heating element 57a and 57b are connected to the electrical lines 80 through material 54a and 54b in FIGS. 14 and 15, respectively), and connected to the electrical lines 90 (omitted for clarity in FIGS. 14, 15, and 16) either directly or through the material 54a, 54b, and 54, respectively and thermal insulator/electrical resistor 52 and top contact metal 51, and wherein portions of the heating element 57 unconnected to the electrical lines 80, 90 are surrounded by the phase change material 45, wherein the pore structure 42 is formed by depositing the phase change material 45 on sidewalls of the pore structure 42, and wherein the heating element 57 and the sensing element 53 are deposited in a center of the pore structure 42. Furthermore, the method comprises configuring the heating element 57 and the sensing element 53 into a pillar structure 67, configuring the phase change material 45 over the pillar structure 67, and configuring the memory cell 77 into a crosspoint memory array architecture 1 according to one embodiment of the invention.

The basis of operation of the memory cell 77 is the detection of the phase of a phase change material 45 without passing a high density (approximately $10^8$ A/cm$^2$) electric current through the memory cell 77. Each phase of a PCM 45 has different physical characteristics such as crystal structure, density etc. The state of the PCM 45 represents the content of the memory cell 77. Thus, the storage of a '1' in the memory cell 77 is associated with a first phase and a '0' with a second phase. It is also possible to store further bits of information in the same memory cell 77. For example, the spacer material 45 can itself be a composite of different (or a single homogeneous) materials such that a third phase state is stable. This can be extended to further phases to achieve more levels (bits) that can be stored in the memory cell 77.

Additionally, the PCM phases have significant differences in thermal conductivity. This can be measured in a small structure 77 by measuring the temperature of the structure 77 when a known amount of energy is deposited into that structure 77 at a given rate. For small structures (less than approximately 1 micron), thermal equilibrium is established in a short (less than approximately 1 $\mu$sec) time. Thus, the energy flowing out of the structure 77 can be assumed to be very close to the energy deposited into the structure 77. In the memory cell 77 shown in FIGS. 2 through 13 heat flow out through the sidewalls of the pore structure 42 represents a significant amount of the energy flowing out of the cell 77. To a good approximation, this heat flow can be described using conventional heat diffusion methods and is proportional to the temperature drop across the spacer layer 45 divided by the thermal conductivity of the spacer material 45. If the thermal conductivity increases, the temperature drop will decrease, and the temperature of the cell 77 will be less for a given rate of energy deposition. Thus, measuring the cell temperature when a known amount of energy is deposited in the cell 77 allows the thermal conductivity of the spacer layer 45 and hence the phase of the PCM comprising that spacer layer 45 to be measured.

In the embodiments described here, the energy is deposited and the temperature measured by the same structure which is a diode 53a/54a, thermistor 53b, thermocouple 53b, or thermal resistor 53b. In each case, the electrical properties of the structure are sensitive to the temperature of the structure. In the case where a diode 53a/54a is used the operation may be as follows. A voltage is applied across the cell 77 by applying suitable potentials to the upper 90 and lower 80 interconnect wires connected to that cell 77. The current flowing through the cell 77 is measured using a conventional current sense amplifier. The current flowing is a known function of the voltage applied to the cell 77, the electronic properties of the material from which the diode 53a/54a is made and the temperature of the diode 53a/54a.

Similarly, the energy dissipated by the diode 53a/54a into the memory cell 77 is the product of the voltage across the cell 77 and the current through the cell 77. Thus, by measuring the current through, and the voltage across, the memory cell 77, the temperature of the cell 77 can be measured, and from the temperature measurement, the state of the PCM 45 can be inferred. As the state of the PCM 45 reflects the memory state of the cell 77, it is also possible to compare the current through, for a given voltage across, the memory cell 77 being read with a reference cell of a known state to determine the state of the memory cell 77.

The temperature can also be read with a structure comprising a material which has an electronic property (such as resistivity or thermo-voltage) that is a function of temperature. Here, the detector 50 is fabricated as described above and operated in an analogous way. The temperature is inferred from the electrical characteristics of the cell 77 when a given amount of power is dissipated in the cell 77. In the case of a thermal resistor, it is the resistance of the cell 77 that allows the temperature to be measured and the state of the cell 77 inferred. Again, comparison to a reference cell can be made.

Furthermore, the PCM 45 is fabricated in thermal contact with the detector/heater structure 50 by ensuring that there is minimal physical separation (less than 10 nm) between the two materials 45, 50. Rather than direct contact, it is preferred to separate the PCM 45 and detector/heater 50 by a thin (less than 10 nm) diffusion barrier (not shown) of a material to prevent intermixing of the materials in the different structures 45, 50. The diffusion barrier (not shown) must have low electrical conductivity or be insulating and can be any such material stable at high (600° C.) temperatures such as tantalum silicon nitride (TaSiN) or similar materials. The thermal conductivity of the material is not a particular concern as the layer is thin (less than approximately 10 nm) but a thermal conductivity similar to the ILD 40 is preferred.

The combination of a detector and heater structure 50 can be achieved by the use of structure or material having an electrical property that varies with temperature. For example, the current through a diode 53a/54a is an exponential function of temperature. The current through a thermal resistor 53b is a function of the resistivity of the material comprising the thermoresistor, which itself is a function of temperature. The voltage generated by a thermocouple 53b, a junction 57b between two metals 53b, 54b, is similarly a function of temperature.

The heater functionality is achieved by applying a voltage across the cell 77 to drive a current through that cell 77. The heat applied to the cell 77 is given by the product of the current and voltage. The operation of the memory cell 77 requires a low rate of energy deposition for the "read" process so that the temperature of the cell 77 is maintained below the phase transition temperature. This temperature is a property of the PCM 45 and can vary from room temperature (25° C.) to 500° C. To "write" the cell 77, a higher power is applied to the cell 77 to heat the cell 77 to the phase transition temperature. This is typically performed by applying a short voltage pulse (approximately 10 ns to 1 $\mu$sec) across the cell 77 to drive a current through the cell 77. Moreover, the pulse shape may be tailored to generate a particular temperature profile during the pulse.

An embodiment of the invention provides techniques for indirectly switching and detecting the phase of a PCM 45 in a memory cell 77. That is, the PCM 45 is not in the direct electrical signal path. Additionally, an embodiment of the invention provides an alternative direct sensing method with enhanced sensitivity. In addition to a change in electrical resistance, there is a change in thermal conductivity associated with the phase change of the PCM 45. This change in the thermal conductivity can be substantial. For example, for $Ge_2Sb_2Te_5$, this change is nearly an order of magnitude. The change in thermal conductivity affects the amount of heat that flows away from a heater 50 which is in contact with the PCM 45. Thus, the temperature of the heater after a known amount of energy is dissipated in the heater 50 is an indication of the phase of the PCM 45. This is achieved by incorporating a thermometer into the heater 50 in contact with or surrounded by the PCM 45. Heat is supplied to the heater 50 directly (i.e. by passing a current through the object) or indirectly. Suitable thermometers include a thermocouple 53b, an electronic diode 53a/54a such as a p-n junction 57a or Schottky diode, or a metal 53b with a known temperature coefficient of resistance.

An advantage of an embodiment of the invention's indirect method of detecting the state of the PCM 45 is that the PCM 45 is not subjected to the stress associated with the high current densities required to apply heat and/or measure the temperature of the PCM 45. These high currents can cause degradation of the materials in the PCM 45 by electromigration which causes memory failure and limits the useable lifetime of the memory cell 77. A further advantage is that the same structure 53 is used for both switching (heating) the PCM 45 and sensing (reading) the state of the PCM 45.

The foregoing description of the specific embodiments will so fully reveal the general nature of the embodiments of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the several embodiments of the invention can be practiced with modification within the spirit and scope of the appended claims.

What is claimed is:

1. A memory cell comprising:
   a phase change material;
   a pillar structure comprising:
      a sensing element in thermal contact with said phase change material; and
      a heating element in thermal contact with said phase change material, wherein said heating element is adapted to induce a phase change in said phase change material, and wherein said heating element and said sensing element comprise a same structure, wherein said phase change material surrounds side portions of said heating element; and
   electrical lines configured to pass current through said heating element,
   wherein said phase change material and said heating element are arranged in a configuration other than being electrically connected in series, and
   wherein said phase change material is configured over said pillar structure.

2. The memory cell of claim 1, wherein said heating element is in a direct electrical path between said electrical lines.

3. The memory cell of claim 1, wherein at least a part of a length of said heating element and said phase change material are electrically connected in parallel between said electrical lines.

4. The memory cell of claim 1, wherein said heating element and said phase change material are electrically isolated from each other.

5. The memory cell of claim 1, wherein the change in phase of said phase change material is detected by direct electrical measurement of said change in electrical resistance of said memory cell.

6. The memory cell of claim 1, wherein said sensing element is adapted to detect a change in at least one physical property of said phase change material.

7. The memory cell of claim 6, wherein said sensing element is adapted to detect a change in a thermal conductivity of said phase change material.

8. The memory cell of claim 6, wherein said sensing element comprises a diode.

9. The memory cell of claim 8, wherein said diode comprises a Schottky diode.

10. The memory cell of claim 6, wherein said sensing element comprises a thermometer.

11. The memory cell of claim 6, wherein said sensing element comprises at least one of a thermistor, a thermocouple, and a thermal resistor.

12. The memory cell of claim 6, wherein said heating element and said sensing element comprise a same structure.

13. The memory cell of claim 1, wherein said phase change material comprises at least one of germanium, antimony, tellurium, selenium, polonium, indium, arsenic, silver, gold, sulfur, tin, and lead.

14. The memory cell of claim 1, wherein said phase change material comprises a dopant material comprising at least one of carbon, oxygen, nitrogen, and tin.

15. The memory cell of claim 14, wherein said dopant material comprises a dopant concentration between 0.01 and 30%.

16. The memory cell of claim 6, further comprising:
a body portion; and
a pore structure within said body portion,
wherein said pore structure comprises said heating element
wherein portions of said heating element are connected to said electrical lines, and
wherein portions of said heating element unconnected to said electrical lines are surrounded by said phase change material.

17. The memory cell of claim 16, wherein said phase change material is configured on sidewalls of said pore structure, and wherein said heating element and said sensing element are configured in a center of said pore structure.

18. The memory cell of claim 1, wherein said memory cell is configured into a crosspoint memory array architecture.

19. A method of manufacturing a memory cell, said method comprising:
forming a phase change material;
forming a heating element to be in thermal contact with said phase change material, wherein said heating element is adapted to induce a phase change in said phase change material, wherein said ohase chancie material is formed to surround side portions of said heating element;
forming a sensing element in thermal contact with said phase change material;
configuring said heating element and said sensing element into a pillar structure;
configuring said phase change material over said pillar structure; and
configuring electrical lines to pass current through said heating element,
wherein in said forming of said heating element, said phase change material and said heating element are arranged in a configuration other than being electrically connected in series.

20. The method of claim 19, wherein in said forming of said heating element, said heating element is formed in a direct elecirical path between said electrical lines.

21. The method of claim 19, wherein in said forming of said heating element, at least a part of a length of said heating element and said phase change material are electrically connected in parallel between said electrical lines.

22. The method of claim 19, wherein in said forming of said heating element, said heating element and said phase change material are electrically isolated from each other.

23. The method of claim 19, wherein in said configuring, the change in phase of said phase change material is detected by direct electrical measurement of said change in electrical resistance of said memory cell.

24. The method of claim 19, wherein said sensing element is adapted to detect a change in at least one physical property of said phase change material.

25. The method of claim 24, wherein in said forming of said sensing element, said sensing element is adapted to detect a change in a thermal conductivity of said phase change material.

26. The method of claim 24, wherein in said forming of said sensing element, said sensing element comprises a diode.

27. The method of claim 26, wherein in said forming of said sensing element, said diode comprises a Schottky diode.

28. The method of claim 24, wherein in said forming of said sensing element, said sensing element comprises a thermometer.

29. The method of claim 24, wherein in said forming of said sensing element, said sensing element comprises at least one of a thermistor, a thermocouple, and a thermal resistor.

30. The method of claim 24, wherein said heating element and said sensing element are formed into a same structure.

31. The method of claim 19, wherein in said forming of said phase change material, said phase change material comprises at least one of germanium, antimony, tellurium, selenium, polonium, indium, arsenic, silver, gold, sulfur, tin, and lead.

32. The method of claim 19, wherein in said forming of said phase change material, said phase change material comprises a dopant material comprising at least one of carbon, oxygen, nitrogen, and tin.

33. The method of claim 32, wherein in said forming of said phase change material, said dapant material comprises a dopant concentration between 0.01 and 30%.

34. The method of claim 24, further comprising:
forming a body portion; and
forming a pore structure within said body portion,
wherein said pore structure comprises said heating element,
wherein portions of said heating element are connected to said electrical lines, and
wherein portions of said heating element unconnected to said electrical lines are surrounded by said phase change material.

35. The method of claim 34, wherein in said forming of said pore structure, said pore structure is formed by depositing said phase change material on sidewalls of said pore structure, and wherein said heating element and said sensing element are deposited in a center of said pore structure.

36. The method of claim 19, further comprising configuring said memory cell into a crosspoint memory array architecture.

37. A method of indirectly switching and sensing phase change memory cells, said method comprising:
contacting a heating element with a phase change material, wherein said phase change material is formed to surround side portions of said heating element;
contacting a sensing element with said phase change material;
configuring said heating element and said sensing element into a pillar structure;
configuring said phase change material over said pillar structure;
sending electrical current trough said heating element; and
inducing a phase change in said phase change material,
wherein in said contacting, said phase change material and said heating element are arranged in a configuration other than being electrically connected in series.

38. The method of claim 37, wherein in said contacting, said heating element is formed in a direct electrical path between electrical lines carrying said electrical current.

39. The method of claim 37, wherein in said contacting, at least a part of a length of said heating element and said phase change material are electrically connected in parallel between electrical lines carrying said electrical current.

40. The method of claim 37, wherein in said contacting, said heating element and said phase change material are electrically isolated from each other.

41. The method of claim 37, further comprising detecting the change in phase of said phase change material by direct electrical measurement of said change in electrical resistance of said memory cell.

42. The method of claim 37, wherein said sensing element is adapted to detect a change in at least one physical property of said phase change material.

43. The method of claim 42, wherein in said contacting of said sensing element with said phase change material, said sensing element is adapted to detect a change in a thermal conductivity of said phase change material.

44. The method of claim 42, wherein in said contacting of said sensing element with said phase change material, said sensing element comprises a diode.

45. The method of claim 44, wherein in said contacting of said sensing element with said phase change material, said diode comprises a Schottky diode.

46. The method of claim 42, wherein in said contacting of said sensing element with said phase change material, said sensing element comprises a thermometer.

47. The method of claim 42, wherein in said contacting of said sensing element with said phase change material, said sensing element comprises at least one of a thermistor, a thermocouple, and a thermal resistor.

48. The method of claim 42, wherein said heating element and said sensing element are formed into a same structure.

49. The method of claim 37, wherein in said contacting of said heating element with said phase change material, said phase change material comprises at least one of germanium, antimony, tellurium, selenium, polonium, indium, arsenic, silver, gold, sulfur, tin, and lead.

50. The method of claim 37, wherein in said contacting of said heating element with said phase change material, said phase change material comprises a dopant material comprising at least one of carbon, oxygen, nitrogen, and tin.

51. The method of claim 50, wherein in said contacting of said heating element with said phase change material, said dopant material comprises a dopant concentration between 0.01 and 30%.

52. The method of claim 37, further comprising forming a pore structure within a body portion of said memory cell, wherein said pore structure comprises said heating element, wherein portions of said heating element are connected to electrical lines carrying said electrical current, and wherein portions of said heating element unconnected to said electrical lines are surrounded by said phase change material.

53. The method of claim 52, wherein in said forming, said pore structure is formed by depositing said phase change material on sidewalls of said pore structure, and wherein said heating element and said sensing element are deposited in a center of said pore structure.

54. The method of claim 37, further comprising configuring said memory cell into a crosspoint memory array architecture.

55. The memory cell of claim 1, wherein said phase change material comprises a dopant material comprising at least one of carbon and tin.

56. The method of claim 19, wherein in said forming of said phase change material, said phase change material comprises a dopant material comprising at least one of carbon and tin.

57. The method of claim 37, wherein in said contacting of said heating element with said phase change material, said phase change material comprises a dopant material comprising at least one of carbon and tin.

* * * * *